United States Patent
Hata et al.

(10) Patent No.: US 11,212,908 B2
(45) Date of Patent: Dec. 28, 2021

(54) SEMICONDUCTOR APPARATUS

(71) Applicant: Mitsubishi Electric Corporation, Tokyo (JP)

(72) Inventors: Yuki Hata, Tokyo (JP); Akira Yamamoto, Fukuoka (JP); Shintaro Araki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 165 days.

(21) Appl. No.: 16/614,347

(22) PCT Filed: Jul. 21, 2017

(86) PCT No.: PCT/JP2017/026404
§ 371 (c)(1),
(2) Date: Nov. 15, 2019

(87) PCT Pub. No.: WO2019/016932
PCT Pub. Date: Jan. 24, 2019

(65) Prior Publication Data
US 2020/0196432 A1   Jun. 18, 2020

(51) Int. Cl.
*H05K 1/02* (2006.01)
*H01L 23/552* (2006.01)

(52) U.S. Cl.
CPC .......... *H05K 1/023* (2013.01); *H01L 23/552* (2013.01); *H05K 2201/10166* (2013.01); *H05K 2201/10174* (2013.01); *H05K 2201/10371* (2013.01); *H05K 2201/10689* (2013.01); *H05K 2201/10757* (2013.01)

(58) Field of Classification Search
CPC .......................................... H05K 1/023–0236
See application file for complete search history.

(56) References Cited

FOREIGN PATENT DOCUMENTS

| JP | H05-82210 A | 4/1993 |
|---|---|---|
| JP | 2004-200235 A | 7/2004 |
| JP | 2013-239278 A | 11/2013 |

OTHER PUBLICATIONS

An Office Action mailed by China National Intellectual Property Administration dated Jan. 4, 2021, which corresponds to Chinese Application No. 201780093341.X and is related to U.S. Appl. No. 16/614,347 with English language translation.
International Search Report; Written Opinion; and Notification of Transmittal of the International Search Report and the Written Opinion of the International Searching Authority, or the Declaration issued in PCT/JP2017/026404; dated Oct. 10, 2017.

*Primary Examiner* — Jeremy C Norris
(74) *Attorney, Agent, or Firm* — Studebaker & Brackett PC

(57) ABSTRACT

A semiconductor apparatus includes a metal body in which a through hole is formed, a socket that covers the metal body without closing the through hole, a connection terminal connected to the metal body and exposed to an outside of the socket, a control board having a metal pattern and a circuit pattern, and a semiconductor chip having a control terminal connected to the circuit pattern via the through hole without being in contact with the metal body, the connection terminal being connected to the metal pattern.

20 Claims, 8 Drawing Sheets

SEMICONDUCTOR APPARATUS

FIELD

The present invention relates to a semiconductor apparatus used in control of a large amount of power, for example.

BACKGROUND

For example, in a semiconductor apparatus called a power semiconductor apparatus and handling a large amount of power, a control terminal is provided in a semiconductor device, and the control terminal is used to apply a voltage to a gate and extract a signal for current detection and temperature detection. In order to connect the control terminal to a control board, the control terminal needs to have a certain length. Also, since the control terminal is naked, it is susceptible to external noise.

In power semiconductor apparatus or the like which needs to have high reliability, it is necessary to connect the control terminal directly to the control board and solder these two components to be securely fixed to each other. Removable components for connection that can be easily removed such as a socket or the like that is commonly used as an electrical connection is not preferable. In view of this fact, a relatively long control terminal portion from the semiconductor device to the control board is left in a naked state. The control terminal exposed to the outside is susceptible to external noise, which may cause a malfunction or false detection of a signal. It should be noted that the external noise is, for example, noise from a semiconductor device or noise from load wiring.

The patent literature PTL 1 discloses a socket for an electronic component that includes a shield. The patent literature PTL 2 discloses a structure in which a terminal is directly connected to a substrate and a shielding potential is brought into contact with the terminal so as to provide a shielding effect.

PRIOR ART

Patent Literature

PTL 1: JP 2013-239278 A
PTL 2: JP 2004-200235 A

SUMMARY

Technical Problem

The socket for electronic components disclosed in the patent literature PTL 1, in terms of contact resistance or vibration resistance, cannot be applied to power semiconductor apparatuses or the like that is required to have high reliability, which has hitherto been a problem. In the technique disclosed in the patent literature PTL 2, since the shield potential must be matched with the potential of any of the terminals, a noise voltage is generated due to the influence of the wiring inductance, which makes it difficult to supply a stable shield. For example, when shielding is based on the emitter terminal as the reference, a large current flows between the gate and the emitter at the moment when the gate is turned on and off, so that there has been a risk that the noise voltage may sneak into the shield due to the influence of the inductance of the emitter wiring on the control board side than the control terminal. Also, when shield is provided with the cathode terminal used as a reference, the inductor may be directly connected into the sensor circuit of the control board in order to stably measure the potential between the anode and the cathode, so that the cathode is not directly connected to the GND potential, making it difficult to obtain a stable shielding effect.

Some examples described herein may provide a semiconductor apparatus capable of reducing the influence of noise.

Means for Solving the Problems

In some examples, a semiconductor apparatus includes a metal body in which a through hole is formed, a socket that covers the metal body without closing the through hole, a connection terminal connected to the metal body and exposed to an outside of the socket, a control board having a metal pattern and a circuit pattern, and a semiconductor chip having a control terminal connected to the circuit pattern via the through hole without being in contact with the metal body, the connection terminal being connected to the metal pattern.

Other features will be disclosed below.

Advantageous Effects of Invention

According to some examples, since the metal body used for shielding of the control terminal is connected to the metal pattern of the control board, a semiconductor apparatus in which the influence of noise is reduced can be provided.

DESCRIPTION OF EMBODIMENTS

Figure 1:
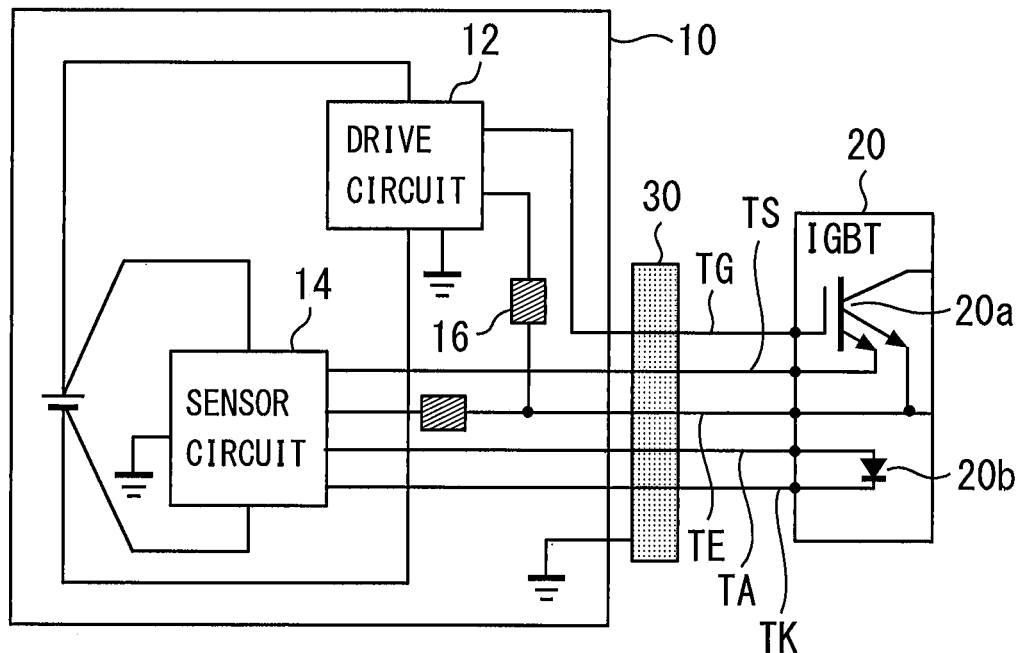
FIG. 1 is a configuration diagram of the semiconductor apparatus according to Embodiment 1.

A semiconductor apparatus according to an embodiment will be described with reference to the drawings. The same or corresponding constituent elements are assigned the same reference numerals and repetition of description may be omitted.

Embodiment 1

FIG. 1 is a configuration diagram of the semiconductor apparatus according to Embodiment 1. This semiconductor apparatus includes a control board 10. The control board 10 includes, for example, a substrate, a plurality of devices constituting a circuit, a circuit pattern interconnecting the devices, and a metal pattern. In FIG. 1, it is shown that the control board 10 includes a drive circuit 12, a sensor circuit 14, and a wiring inductance 16.

The control board 10 is connected to a semiconductor chip 20 by control terminals TG, TS, TE, TA, and TK. In the semiconductor chip 20, an insulated gate bipolar transistor (IGBT) 20a and a diode 20b are formed. A device of another type may be formed in the semiconductor chip 20. The semiconductor chip 20 includes control terminals TG, TS, TE, TA, and TK extending to an outside. The control terminals TG, TS, TE, TA, and TK are connected to a gate, a signal terminal, and an emitter of the IGBT 20a; and an anode and a cathode of the diode 20b, respectively.

For example, in a power semiconductor apparatus that is required to have high reliability, it is necessary to connect the naked control terminals TG, TS, TE, TA, and TK to the control board 10 and thereby establish electrical connection between the control board 10 and the semiconductor chip 20. As a result, the relatively long control terminals TG, TS, TE, TA, and TK are exposed from the semiconductor chip 20 to the control board 10. In order to protect such control terminals TG, TS, TE, TA, and TK from influence of external noise, a shield structure 30 is provided. The shield structure 30 covers the control terminals TO, TS, TE, TA, and TK.

Figure 2:
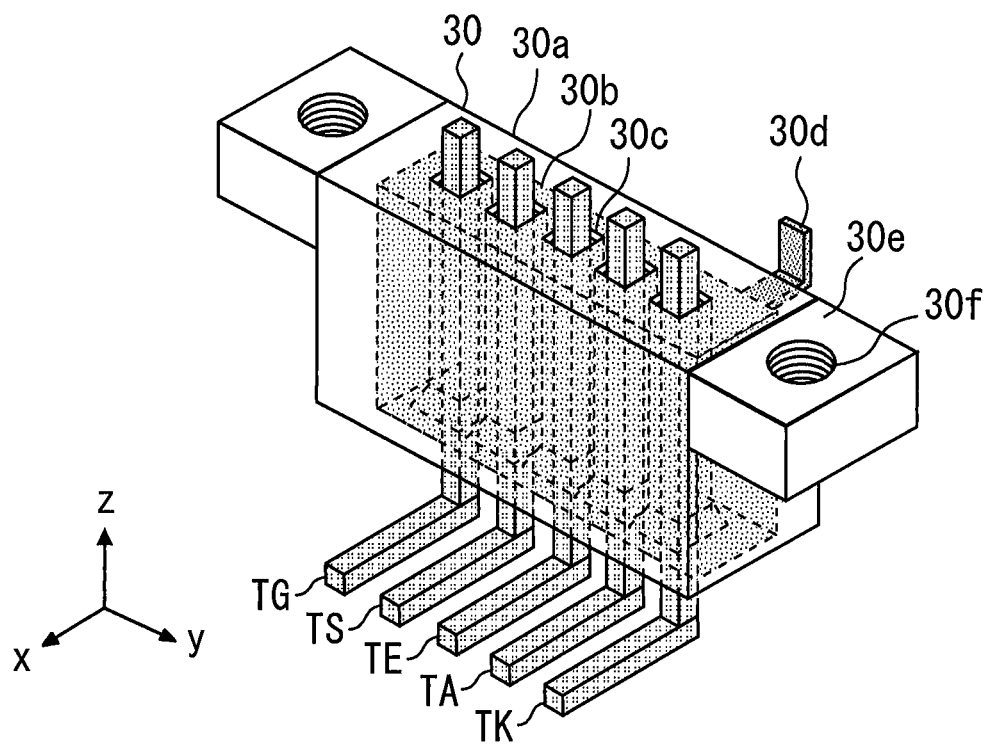
FIG. 2 is a perspective view of the shield structure and the control terminals.

FIG. 2 is a perspective view of the shield structure 30 and the control terminals TG, TS, TE, TA, and TK. The shield structure 30 includes a metal body 30b in which through holes 30c are formed. While the material of the metal body 30b is not in particular limited as long as it is a metal having a shielding effect, it may for example be aluminum (Al) or copper (Cu). In the metal body 30b, five through holes 30c are formed which extend through the metal body 30b in the z-direction.

The metal body 30b is covered by a socket 30a. The socket 30a covers the metal body 30b without closing the through holes 30c. For example, the socket 30a is brought into contact with the upper and lower surfaces of the metal body 30b. It is preferable that the material of the socket 30a is an insulating material.

To the metal body 30b, a connection terminal 30d is connected. The connection terminal 30d is exposed to the outside of the socket 30a. The connection terminal 30d is a terminal that connects the metal body 30b to the outside. To be more specific, the connection terminal 30d is a terminal for connecting the metal body 30b to a portion on the control board 10 to which an electric potential serving as the reference of the shield is to be imparted. For example, it is preferable that the connection terminal 30d be connected to a GND potential of the circuit in which a large current does not flow as in the sensor circuit and influence of nose due to the wiring inductance is small.

A mounting portion 30e is attached to a side surface of the socket 30a. In the mounting portion 30e, a threaded hole 30f is formed. In FIG. 2, it is shown that two mounting portions 30e are attached to the socket 30a.

The control terminals TG, TS, TE, TA, and TK have an L-shaped shape. The control terminals TG, TS, TE, TA, and TK pass through the through hole 30c without being in contact with the metal body 30b. The control terminals TG, TS, TB, TA, and TK are not electrically connected to the metal body 30b. The portions extending in the x-direction of the control terminals TG, TS, TE, TA, and TK are connected to the semiconductor chip 20 and their portions extending in the z-direction are connected to the control board 10.

Figure 3:
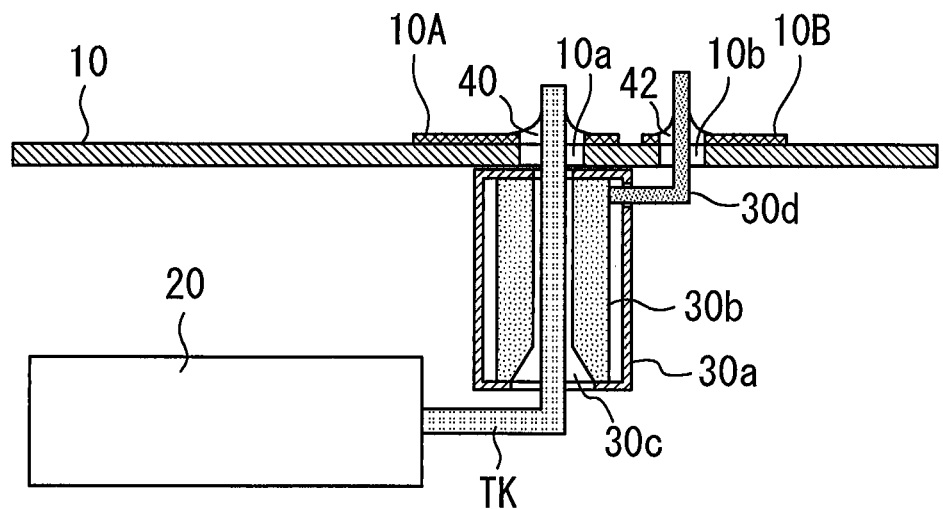
FIG. 3 is a cross-sectional view of the semiconductor apparatus.

FIG. 3 is a cross-sectional view of the semiconductor apparatus. In the control board 10, through holes 10a and 10b are provided. On the upper surface of the control board 10, a circuit pattern 10A and a metal pattern 10B are formed. The control terminal TK extends through the through hole 10a. The control terminal TK is connected by a solder 40 to the circuit pattern 10A. The other control terminals can be likewise connected to the circuit pattern.

The connection terminal 30d extends through the through hole 10b. The connection terminal 30d is connected by a solder 42 to the metal pattern 10B. Specifically, the connection terminal 30d passes through the through hole 10b of the control board 10 and is soldered to the metal pattern 10B formed on the upper surface of the control board 10. The metal pattern 10B is a pattern that provides the reference potential of shielding by the metal body 30b. For example, it is preferable that a metal that provides a GND potential of the sensor circuit be provided as the metal pattern 10B.

Figure 4:
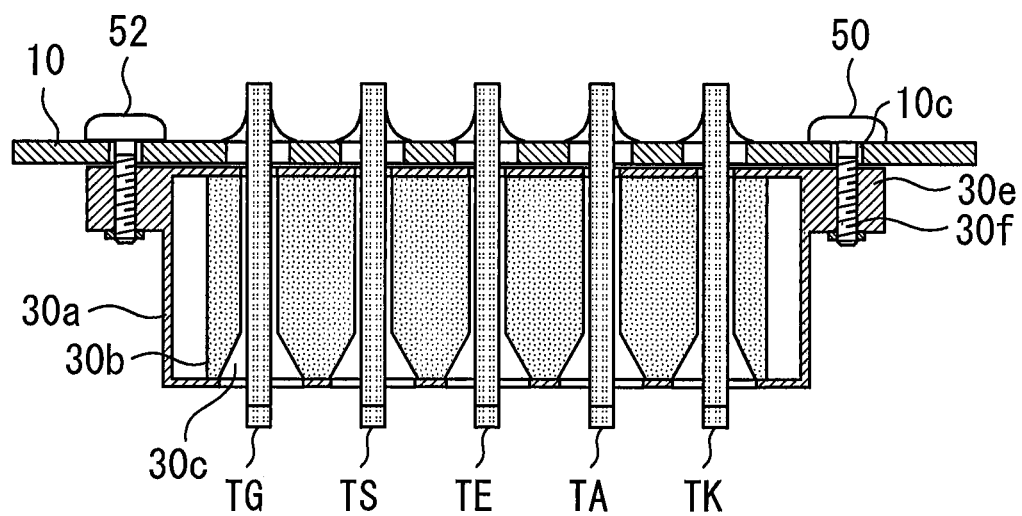
FIG. 4 is another cross-sectional view of the semiconductor apparatus.

FIG. 4 is another cross-sectional view of the semiconductor apparatus. In the control board 10, a through hole 10c is formed. The screws 50, 52 pass through the through hole 10c and is brought into threaded engagement with the threaded hole 30f of the mounting portion 30e. The control board 10 is fixed to the mounting portion 30e.

A gate drive signal is transmitted from the drive circuit 12 of the control board 10 to the gate of the IGBT 20a via the control terminal TG. The control board 10 receives a signal current from the control terminal TS, detects the emitter potential of the control terminal TE, detects the current of the diode 20b from the control terminals TA, TK, and thereby monitors the operation of the semiconductor chip 20. Since the control terminals TG, TS, TE, TA, and TK are covered by the metal body 30b, it is possible to reduce the influence of the noise from the outside upon the control terminals TG, TS, TE, TA, and TK. Specifically, it is possible to reduce induction noise due to external voltage change or current change, prevent erroneous operation, and stabilize the sensing such as current sensing and temperature sensing. Further, since the connection terminal 30d is integrated with the socket 30a, it is made possible to provide positioning of the control terminals TG, TS, TE, TA, and TK and the control board 10 by passing the connection terminal 30d through the through hole 10b of the control board 10.

In a case where the control terminals TG, TS, TE, TA, and TK electrically connected to the control board 10 are covered by the shield structure 30, it is of importance to connect the metal body 30b of the shield structure 30 to a stable electric potential which noise is less likely to sneak in. In view of this, in Embodiment 1, the connection terminal 30d has been connected to the metal pattern 10B of the control board 10. Out of the metal patterns of the control board 10, by selecting the metal pattern with a stable electric potential as the metal pattern 10B, a stable shielding effect can be obtained. Such a metal pattern is, for example, a GND pattern of the sensor circuit. It is possible to select a metal pattern imparting an electric potential which should be the reference potential of the metal body 30b as the metal pattern 10B.

In the semiconductor apparatus assembly process, first, the control terminals TG, TS, TE, TA, and TK are put below the through hole 30c and the control terminals TG, TS, TE, TA, and TK are moved in the z-positive direction of FIG. 2. At this point, when the through hole 30c of the metal body 30b is made in a tapered shape whose width becomes largest at its lower end, the control terminals TG, TS, TE, TA, and TK can be readily inserted into the through hole 30c. The control terminals TG, TS, TE, TA, and TK are move further in the z-positive direction, and thereby the control terminals TG, TS, TE, TA, and TK are passed through the through hole of the control board 10.

After that, the control terminals TG, TS, TE, TA, and TK and the circuit pattern are soldered. A plurality of circuit patterns are formed on the control board 10 and one circuit pattern is connected to one control terminal. In order to prevent the control terminals TG, TS, TE, TA, and TK from being bent when the control terminals are attached or from being brought into contact with an adjacent control terminal due to such bending, it is preferable that the inner diameter of the through hole 30c of the metal body 30b be defined to be smaller than the inner diameter of the through hole of the control board 10.

Various modifications can be made to the semiconductor apparatus according to Embodiment 1 in a range where its features are not lost. For example, the number of the control terminals can be changed according to the configuration of the semiconductor chip 20. The above-described modified example can also be applied to the semiconductor apparatus according to the following embodiments. It should be noted that the semiconductor apparatus according to the following embodiments have many points in common with the first embodiment, so that the differences from Embodiment 1 will be mainly described.

Embodiment 2

Figure 5:
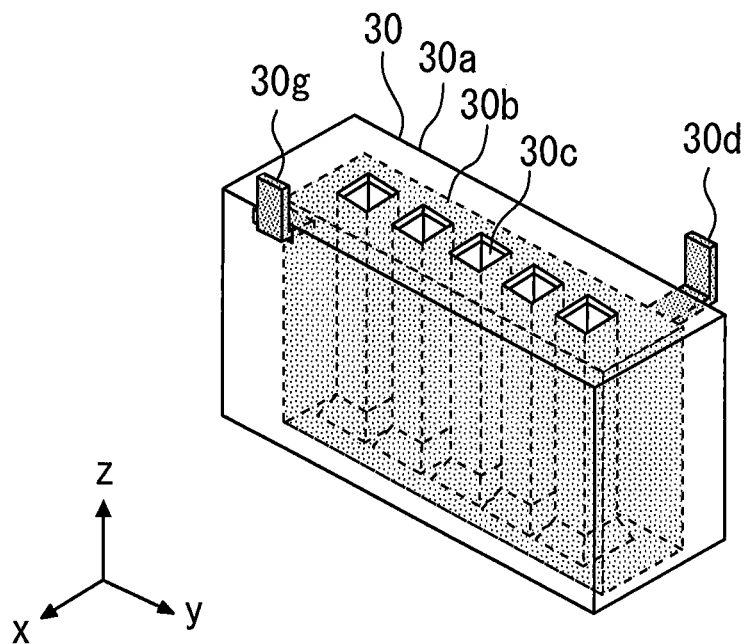
FIG. 5 is a perspective view of a shield structure of the semiconductor apparatus according to Embodiment 2.
Figure 6:
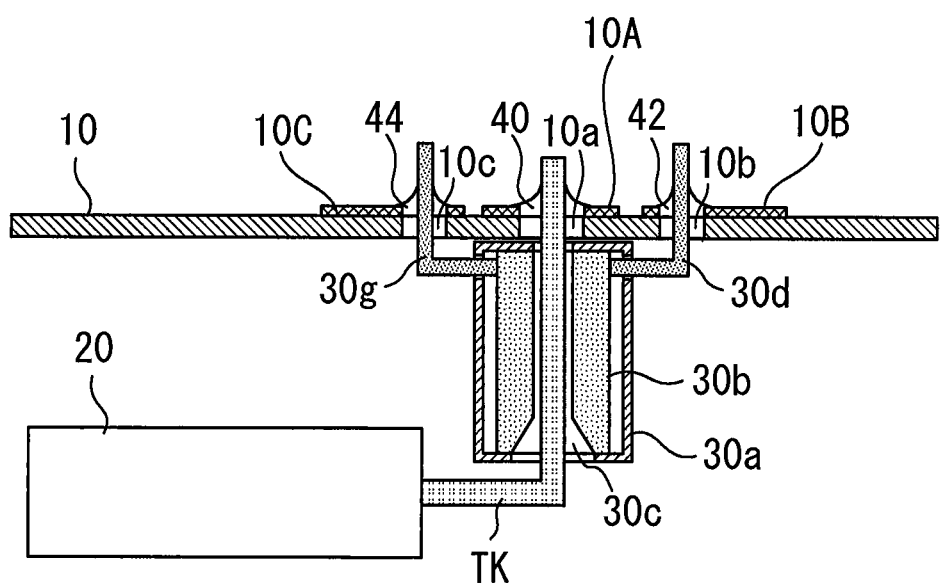
FIG. 6 is a cross-sectional view of the semiconductor apparatus according to Embodiment 2.

FIG. 5 is a perspective view of a shield structure of the semiconductor apparatus according to Embodiment 2. This shield structure 30 includes connection terminals 30d and 30g. The connection terminals 30d and 30g are exposed to the outside on the side surface of the socket 30a. FIG. 6 is a cross-sectional view of the semiconductor apparatus according to Embodiment 2. The connection terminals 30d and 30g pass through the through holes 10b, 10c of the control board 10 and reach (a space) above the control board 10. The connection terminals 30d and 30g are connected to metal patterns 10B and 10C by solders 42, 44. The metal patterns 10B and 10C may be interconnected on the control board 10.

When the control terminals TG, TS, TE, TA, and TK and the connection terminals 30d and 30g are soldered to the control board 10, the shield structure 30 can be positioned relative to the control board 10 by inserting the connection terminals 30d and 30g into predetermined through holes of the control board 10. Also, since the shield structure 30 is stably secured to the control board 10 by means of the connection terminals 30d and 30g, it is not necessary to secure the shield structure 30 to the control board 10 using a screw. Hence, the mounting portions 30e of FIG. 2 can be omitted, which is suitable for miniaturization of the semiconductor apparatus. It should be noted that the above-described effect can be obtained by providing a plurality of connection terminals, so that the number of the connection terminals is not limited to 2.

Embodiment 3

Figure 7:
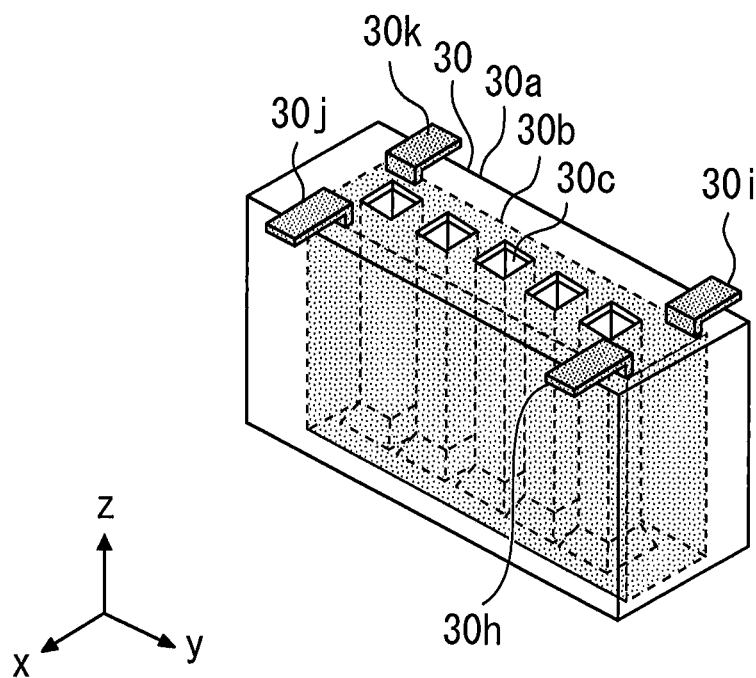
FIG. 7 is a perspective view of a shield structure of the semiconductor apparatus according to Embodiment 3.

FIG. 7 is a perspective view of a shield structure 30 of the semiconductor apparatus according to Embodiment 3. This semiconductor apparatus includes connection terminals 30h, 30i, 30j, and 30k connected to the metal body 30b. The connection terminals 30h, 30i, 30j, and 30k are exposed on the upper surface of the socket 30a.

Figure 8:
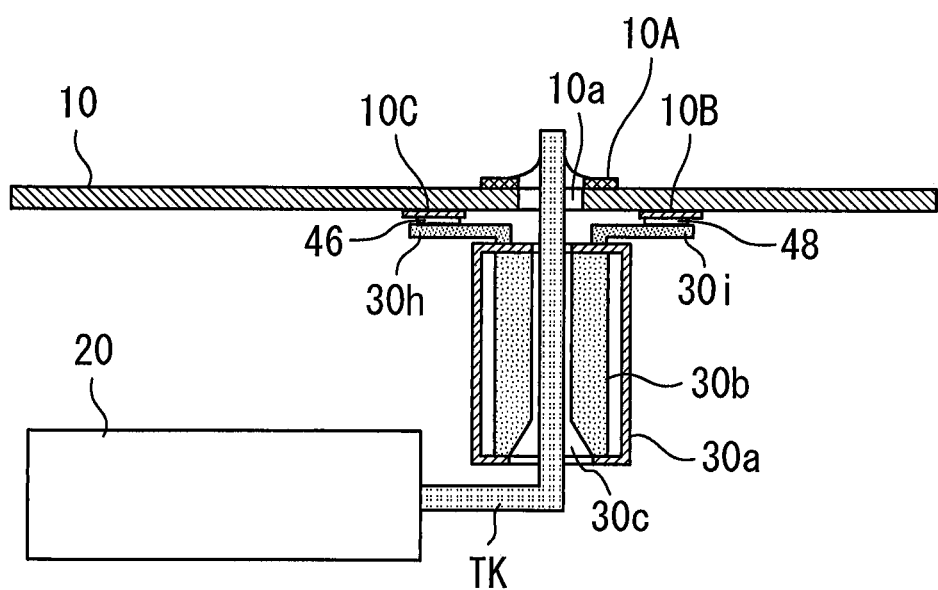
FIG. 8 is a cross-sectional view of the semiconductor apparatus according to Embodiment 3.

FIG. 8 is a cross-sectional view of the semiconductor apparatus according to Embodiment 3. The semiconductor chip 20 is provided below the control board 10. The metal patterns 10B and 10C are formed on the side of the lower surface of the control board 10. All of the connection terminals 30h, 30i, 30j, and 30k are connected to the metal pattern provided on the side of the lower surface of the control board 10. In FIG. 8, it is shown that the connection terminals 30h, 30i are connected to the metal patterns 10C and 10B by solders 46, 48.

In this manner, in Embodiment 3, the connection terminals are soldered on the shield structure mounting surface which is the lower surface of the control board 10. As a result, the connection terminals 30h, 30i, 30j, and 30k can be fixed to the metal pattern simultaneously with surface-mounted components being fixed to the upper surface of the control board 10 by reflow soldering process. Hence, the semiconductor apparatus according to Embodiment 3 is suitable for simplification of the manufacturing process.

Embodiment 4

Figure 9:
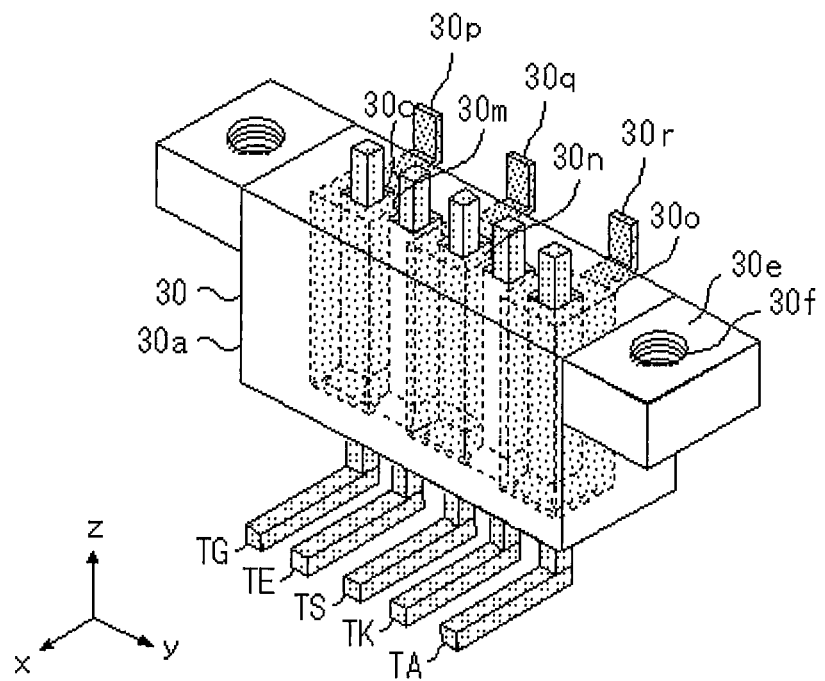
FIG. 9 is a perspective view of the shield structure of the semiconductor apparatus according to Embodiment 4.

FIG. 9 is a perspective view of the shield structure 30 of the semiconductor apparatus according to Embodiment 4. Metal bodies 30m, 30n, and 30o are covered by the socket 30a. Connection terminals 30p, 30q, and 30r are connected to the metal bodies 30m, 30n, and 30o, respectively. The control terminals TG, TS, TE, TA, and TK are terminals of the semiconductor chip.

A part of the control terminal TG resides inside the through hole 30c of the metal body 30m, a part of the control terminal TS resides inside the through hole of the metal body 30n, and a part of the control terminal TA resides inside the through hole of the metal body 30o. The control terminals TE and TK are not covered by the metal body. The control terminals TE and TK, which are provided alongside the control terminals TG, TS, and TA, are unprotected control terminals that extend through the socket 30a without passing through the through hole of the metal body.

In Embodiment 4, all of the control terminals are not enclosed together by the metal body but control terminals on which influence of noise should be reduced are individually covered by a metal body. The control terminals on which influence of noise should be in particular reduced include, for example, the control terminal TG, which is a gate terminal, the control terminal TS which is a current sensing terminal, and the control terminal TA which is an anode terminal. Which of the control terminals should be covered by the metal body may be determined as needed. By virtue of the structure illustrated in FIG. 9, the material cost of the shield structure can be reduced as compared with a case where all of the control terminals are covered by the metal body. Also, it is possible to block noise from an adjacent control terminal.

Embodiment 5

Figure 10:
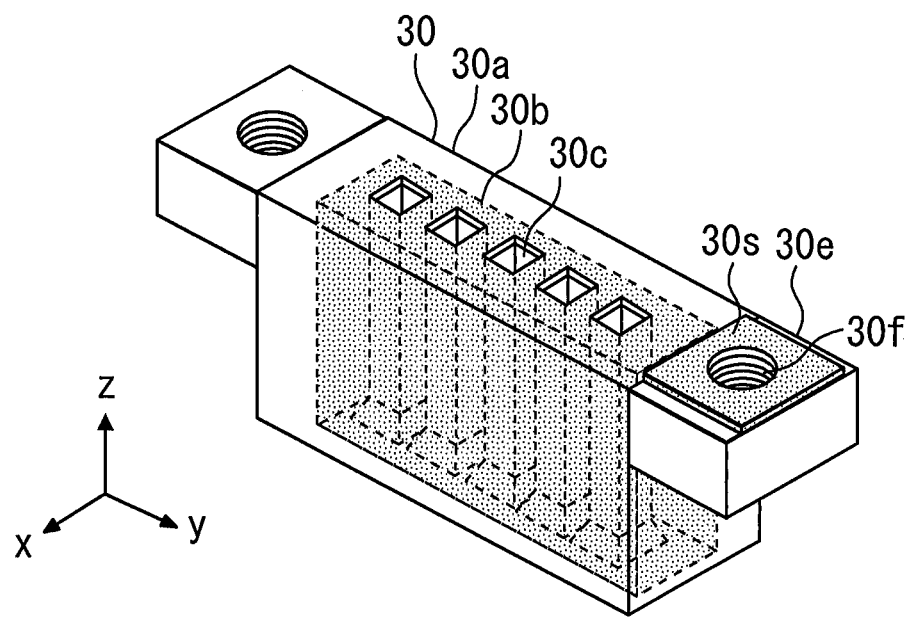
FIG. 10 is a perspective view of the shield structure of the semiconductor apparatus according to Embodiment 5.

FIG. 10 is a perspective view of the shield structure 30 of the semiconductor apparatus according to Embodiment 5. A connection terminal 30s is provided on the mounting portion 30e and provided inside the threaded hole 30f. The connection terminal 30s is connected to the metal body 30b inside the socket 30a.

Figure 11:
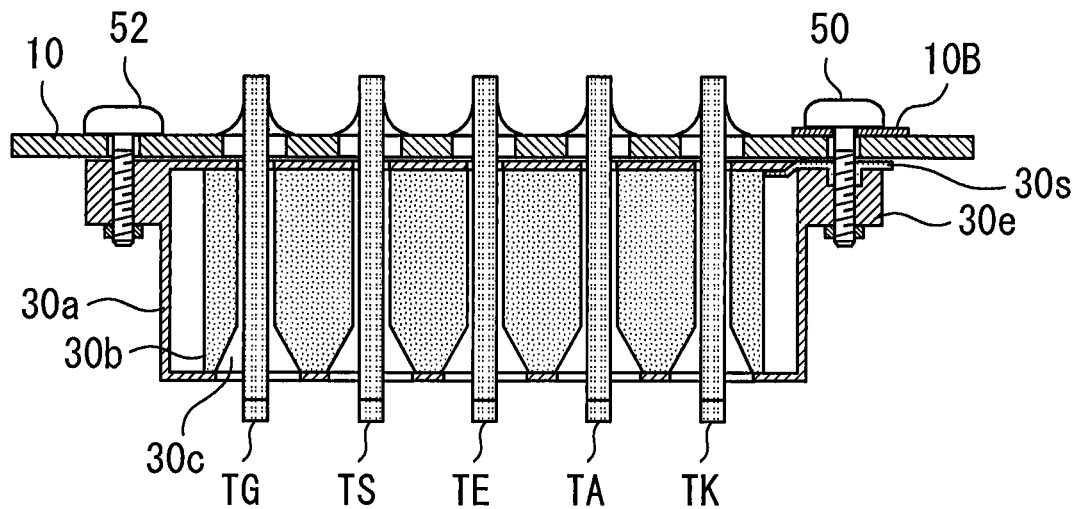
FIG. 11 is a cross-sectional view of the semiconductor apparatus according to Embodiment 5.

FIG. 11 is a cross-sectional view of the semiconductor apparatus according to Embodiment 5. A screw 50 is passed through the through hole of the control board 10 and brought into threaded engagement with the threaded hole 30f of the mounting portion 30e, as a result of which the control board 10 is secured to the mounting portion 30e. At this point, the screw 50 is brought into contact with the metal pattern 10B. The screw 50 is brought into threaded engagement with the threaded hole 30f of the mounting portion 30e, as a result of which it is brought into contact with the connection terminal 30s. That is, the head of the screw 50 is in contact with the metal pattern 10B, and its shaft is in contact with the connection terminal 30s. By virtue of this, the metal pattern 10B and the connection terminal 30s are electrically connected.

The screw 50 and the connection terminal 30s can be brought into contact with each other by providing the connection terminal 30s on the mounting portion 30e. The connection terminal 30s can be electrically connected to the metal pattern 10B by bringing the screw 50 into contact with the metal pattern 10B. According to the semiconductor apparatus of Embodiment 5, since the need of providing a through hole for the connection terminal 30s on the control board 10 can be eliminated, it is possible to increase the degree of freedom of the circuit pattern formed on the control board 10.

In Embodiment 5, the connection terminal 30s is provided inside the threaded hole 30f. However, the connection terminal may not be provided in the threaded hole as long as the connection terminal and a screw can be connected to each other. For example, the connection terminal may be formed on the lower surface of the mounting portion 30e and a nut adapted to be brought into fitting engagement with the screw 50 may be brought into contact with the connection terminal.

Embodiment 6

Figure 12:
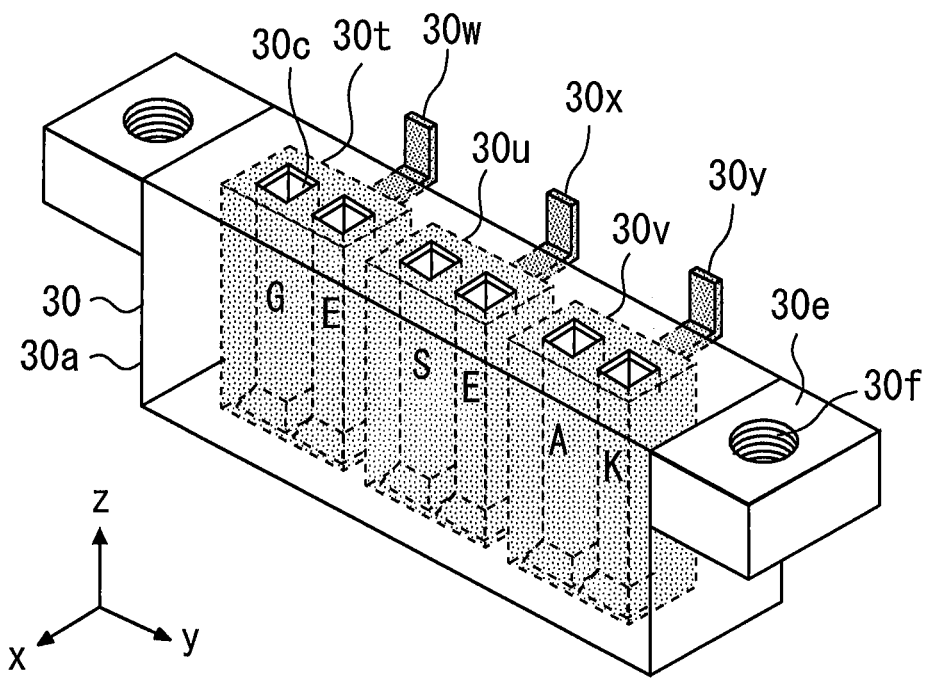
FIG. 12 is a perspective view of the shield structure of the semiconductor apparatus according to Embodiment 6.

FIG. 12 is a perspective view of the shield structure 30 of the semiconductor apparatus according to Embodiment 6. Inside the socket 30a, metal bodies 30t, 30u, and 30v are provided. Connection terminals 30w, 30x, and 30y are connected to the metal bodies 30t, 30u, and 30v, respectively. The connection terminals 30w, 30x, and 30y are connected to the metal pattern of the control board.

"G" in FIG. 12 indicates a portion into which the control terminal TG is inserted, "E" indicates a portion into which the control terminal TE is inserted, "S" indicates a portion into which the control terminal TS is inserted, "A" indicates a portion into which the control terminal TA is inserted, and "K" indicates a portion into which the control terminal TK is inserted. Accordingly, the metal body 30t covers the control terminal TG and the control terminal TE, the metal body 30u covers the control terminal TS and the control terminal TE, and the metal body 30v covers the control terminal TA and the control terminal TK. All the control terminals are insulated from the metal bodies.

In this manner, the control terminals associated with a pair of signals are covered by one single metal body in Embodiment 6. By virtue of this, since the impedances of the outbound and inbound channels of the pair of signals are brought into agreement with each other, the influence of the noise can be reduced in particular when signals are manipulated in a differential fashion.

In Embodiment 6, as the pair of signals, a gate signal for driving the control terminal TG and an emitter current for transmitting the control terminal TE; the signal current for transmitting the control terminal TS and an emitter current for transmitting the control terminal TE, and the anode current flowing in the control terminal TA and a cathode current flowing in the control terminal TK have been mentioned. However, combinations not described in the foregoing as a pair of signals may also be adopted. Generally speaking, as the control terminals, a first control terminal and a second control terminal in which a current proportional to the current of the first control terminal flows are provided, the first control terminal and the second control terminal are covered by the metal body, and thereby the above-described effect can be obtained.

Embodiment 7

Figure 13:
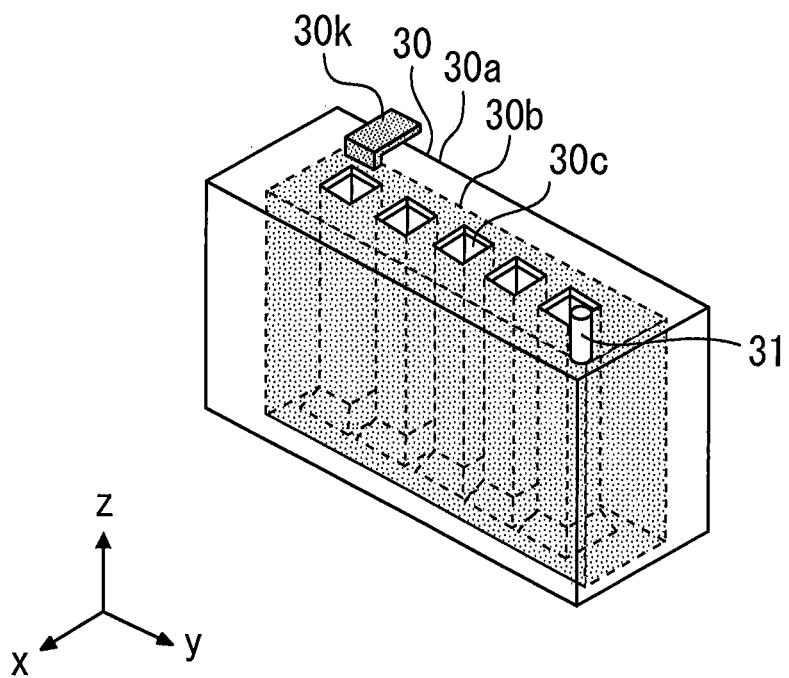
FIG. 13 is a perspective view of the shield structure of the semiconductor apparatus according to Embodiment 7.
Figure 14:
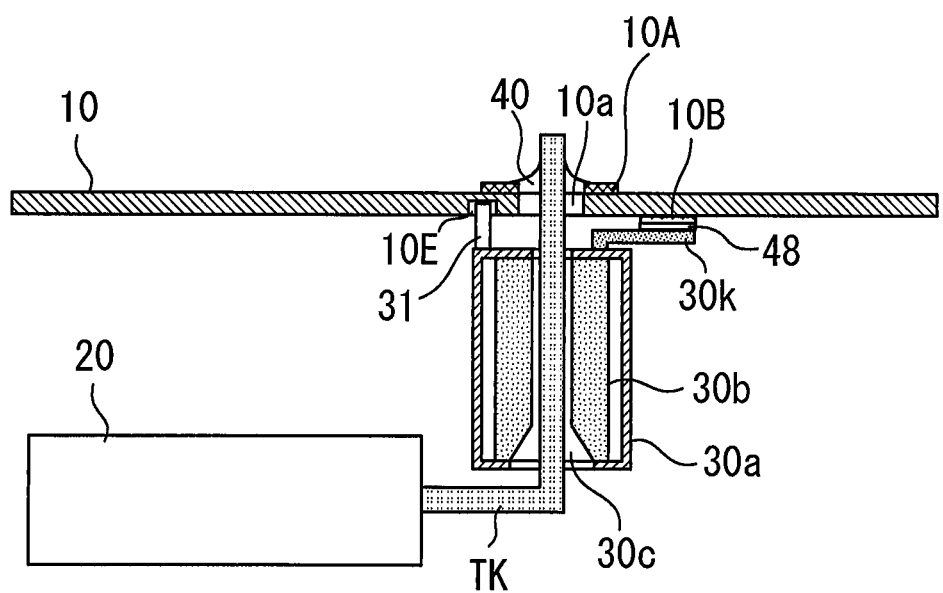
FIG. 14 is a cross-sectional view of the semiconductor apparatus according to Embodiment 7.

FIG. 13 is a perspective view of the shield structure 30 of the semiconductor apparatus according to Embodiment 7. On the upper surface of the socket 30a, a positioning convex portion 31 is provided. The convex portion 31 is a boss that extends in the axial direction which is a direction toward the control board 10. FIG. 14 is a cross-sectional view of the semiconductor apparatus according to Embodiment 7. On the lower surface of the control board 10, a concave portion 10E exists, and the convex portion 31 fits in the concave portion 10E. By inserting the convex portion 31 into the concave portion 10E, it is possible to implement the semiconductor chip 20 at a predetermined location of the control board 10. Further, by providing the convex portion 31, it is possible to eliminate the mounting portion 30e of FIG. 2, so that as compared with the case of FIG. 2, it is possible to reduce the mounting area of the control board 10. As a result, it is possible to increase the degree of freedom of the circuit pattern formed on the control board.

Embodiment 8

Figure 15:
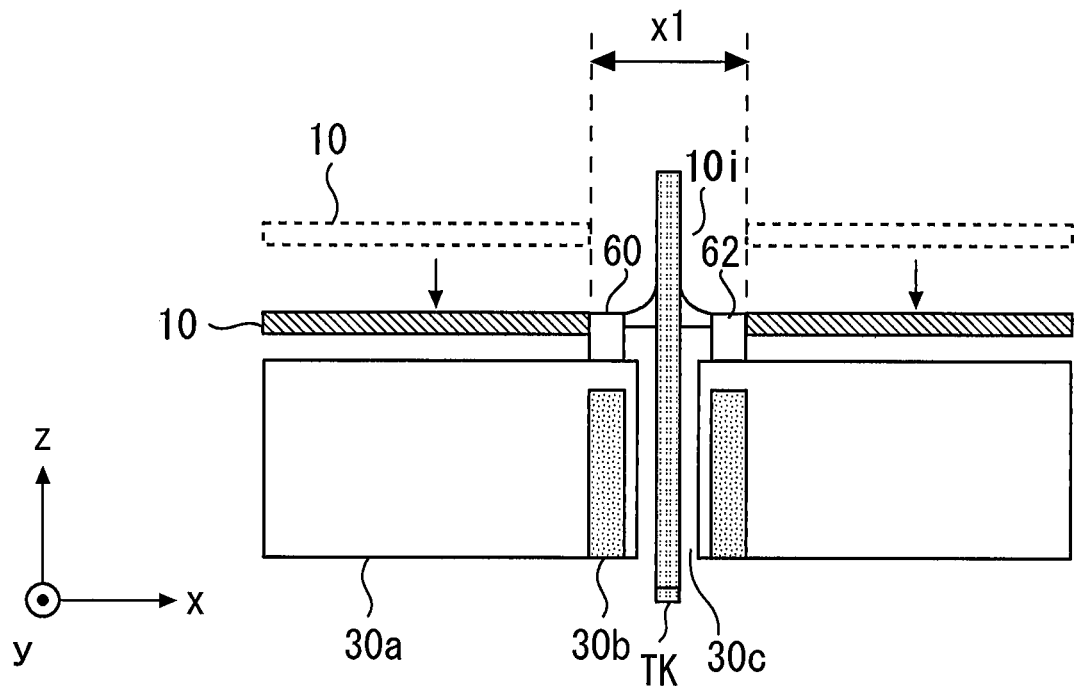
FIG. 15 is a cross-sectional view of the semiconductor apparatus according to Embodiment 8.

FIG. 15 is a cross-sectional view of the semiconductor apparatus according to Embodiment 8. On the upper surface of the socket 30a, convex portions 60 and 62 are provided. The number of the convex portions is not in particular limited as long as it is a plural number. Between the convex portions 60 and 62, the through hole 30c of the metal body 30b is provided, and the control terminal TK extends through the through hole 30c. The width of the convex portions 60 and 62 is defined within the range of the width x1. In other words, the distance from the surface on the opposite side of the through hole 30c of the convex portion 60 to the surface on the opposite side of the through hole 30c of the convex portion 62 is x1.

In the control board 10, a positioning hole 10i is formed. The width of the positioning hole 10i is x1. The control board 10 indicated by the broken line is moved in the z-negative direction, or the shield structure 30 is moved in the z-positive direction, and the control board 10 is placed at the location indicated by the solid line. At this point, by inserting the convex portions 60 and 62 into the positioning hole 10i, the shield structure 30 is implemented at a predetermined location on the control board 10. By virtue of this structure, it is made possible to provide positioning at each control terminal and ensure that positional deviation during assembly is less likely to occur.

Embodiment 9

Figure 16:
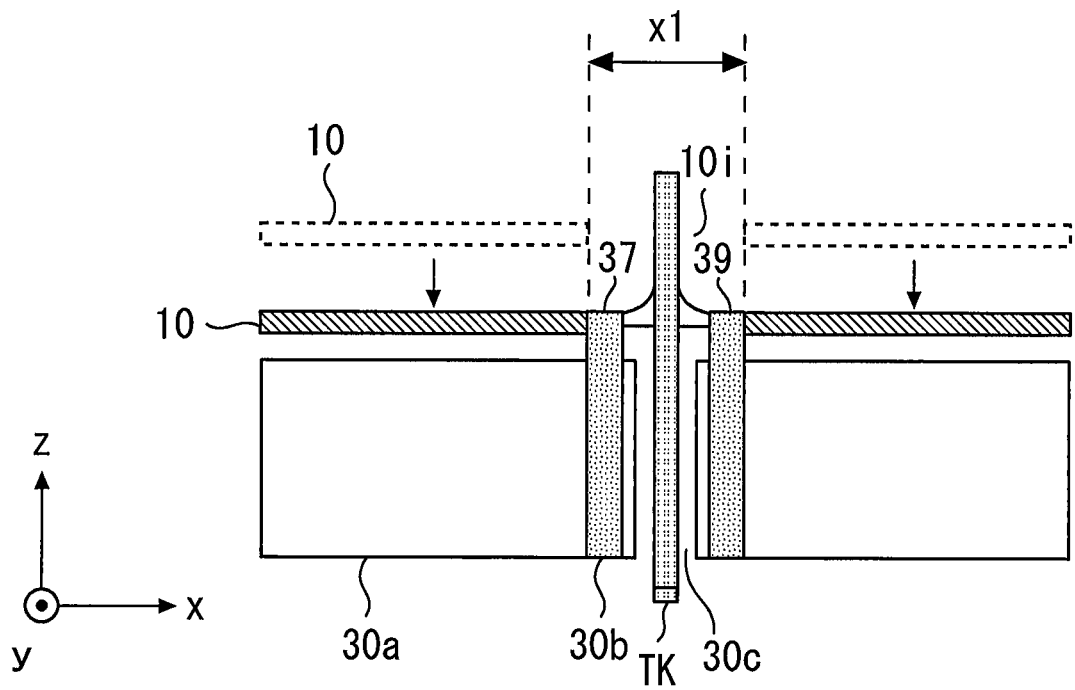
FIG. 16 is a cross-sectional view of the semiconductor apparatus according to Embodiment 9.

In Embodiment 9, the shield structure 30 is positioned relative to the control board 10 according to a method different than that of Embodiment 8. FIG. 16 is a cross-sectional view of the semiconductor apparatus according to Embodiment 9. The metal body 30b has a plurality of metal body convex portions 37, 39 that extend upward so that its upper end is higher than the socket 30a. The widths of the metal body convex portions 37, 39 are defined within the range of the width x1. In other words, the distance from the surface on the opposite side of the through hole 30c of the metal body convex portion 37 to the surface on the opposite side of the through hole 30c of the metal body convex portion 39 is x1.

In the control board 10, a positioning hole 10i is formed. The width of the positioning hole 10i is x1. The control board 10 indicated by the broken line is moved in the z-negative direction, or the shield structure 30 is moved in the z-positive direction, and the control board 10 is placed at the location indicated by the solid line. At this point, by inserting the metal body convex portions 37, 39 into the positioning hole 10i, the shield structure 30 is implemented at a predetermined location on the control board 10. By virtue of this structure, it is made possible to provide positioning at each control terminal and ensure that positional deviation during assembly is less likely to occur. Further, the convex portions 60 and 62 of Embodiment 8 can be eliminated.

As the shield structure 30 of Embodiments 8 and 9, it is possible to adopt the shield structures that have been described in the context of any one of the structures of Embodiments 1 to 7. It should be noted that the features of the semiconductor apparatus according to the above-described embodiments may be combined to enhance the effects described above.

DESCRIPTION OF SYMBOLS 10 control board, 20 semiconductor chip, 30 shield structure, 30a socket, 30b metal body, 30c through holes, 30d connection terminal, 30e mounting portion, TG, TS, TE, TA, TK control terminals

The invention claimed is:

1. A semiconductor apparatus comprising:
   a metal body in which a through hole is formed;
   a socket that covers the metal body without closing the through hole;
   at least one connection terminal connected to the metal body and exposed to an outside of the socket;
   a control board having a metal pattern and a circuit pattern; and
   a semiconductor chip having a control terminal connected to the circuit pattern via the through hole without being in contact with the metal body, the at least one connection terminal being connected to the metal pattern.

2. The semiconductor apparatus according to claim 1, further comprising:
   a mounting portion attached to a side surface of the socket, wherein a threaded hole is formed in the mounting portion; and
   a screw that secures the control board to the mounting portion, wherein the screw extends through a through hole of the control board and is brought into threaded engagement with the threaded hole.

3. The semiconductor apparatus according to claim 2, wherein the at least one connection terminal extends through a through hole of the control board and is soldered to the metal pattern formed on an upper surface of the control board.

4. The semiconductor apparatus according to claim 2, wherein the at least one connection terminal comprises a plurality of connection terminals.

5. The semiconductor apparatus according to claim 2, wherein the semiconductor chip is provided below the control board and the metal pattern is formed on the side of a lower surface of the control board.

6. The semiconductor apparatus according to claim 2, wherein the semiconductor chip is provided alongside the control terminal, the semiconductor apparatus further comprising an unprotected control terminal extending through the socket without passing through the through hole.

7. The semiconductor apparatus according to claim 1, wherein the at least one connection terminal extends through a through hole of the control board and is soldered to the metal pattern formed on an upper surface of the control board.

8. The semiconductor apparatus according to claim 7, wherein the at least one connection terminal comprises a plurality of connection terminals.

9. The semiconductor apparatus according to claim 7, wherein the semiconductor chip is provided below the control board and the metal pattern is formed on the side of a lower surface of the control board.

10. The semiconductor apparatus according to claim 7, wherein the semiconductor chip is provided alongside the control terminal, the semiconductor apparatus further comprising an unprotected control terminal extending through the socket without passing through the through hole.

11. The semiconductor apparatus according to claim 1, wherein the at least one connection terminal comprises a plurality of connection terminals.

12. The semiconductor apparatus according to claim 11, wherein the semiconductor chip is provided below the control board and the metal pattern is formed on the side of a lower surface of the control board.

13. The semiconductor apparatus according to claim 1, wherein the semiconductor chip is provided below the control board and the metal pattern is formed on the side of a lower surface of the control board.

14. The semiconductor apparatus according to claim 1, wherein the semiconductor chip is provided alongside the control terminal, the semiconductor apparatus further comprising an unprotected control terminal extending through the socket without passing through the through hole.

15. The semiconductor apparatus according to claim 1, further comprising:
   a mounting portion attached to a side surface of the socket, wherein a threaded hole is formed in the mounting portion; and
   a screw that secures the control board to the mounting portion, the screw extending through a through hole of the control board and is brought into threaded engagement with the threaded hole, wherein
   the at least one connection terminal is provided on the mounting portion so as to be in contact with the screw, and
   the screw is brought into contact with the metal pattern.

16. The semiconductor apparatus according to claim 15, wherein the at least one connection terminal is provided in the threaded hole.

17. The semiconductor apparatus according to claim 1, wherein the control terminal has a first control terminal and a second control terminal in which current proportional to a current of the first control terminal flows, and
   the metal body covers the first control terminal and the second control terminal.

18. The semiconductor apparatus according to claim 1, wherein a positioning convex portion is provided on an upper surface of the socket, and
    a concave portion is provided on a lower surface of the control board, the positioning convex portion fitting in the concave portion.

19. The semiconductor apparatus according to claim 1, wherein a plurality of convex portions are provided on an upper surface of the socket,
    a positioning hole is formed in the control board, and
    the plurality of convex portions are inserted into the positioning hole.

20. The semiconductor apparatus according to claim 1, wherein the metal body has a plurality of metal body convex portions extending upward so as to be higher than the socket,
    a positioning hole is provided in the control board, and
    the plurality of metal body convex portions are inserted into the positioning hole.

\* \* \* \* \*